United States Patent [19]
Jacks et al.

[11] Patent Number: 5,983,477
[45] Date of Patent: *Nov. 16, 1999

[54] BALL GRID ARRAY REWORK ALIGNMENT TEMPLATE

[76] Inventors: David C. Jacks, 394 Lincoln, Pomona, Calif. 91767; Randall R. Walston, 22533 S. Vermont Ave. #53, Torrance, Calif. 90502

[ * ] Notice: This patent issued on a continued prosecution application filed under 37 CFR 1.53(d), and is subject to the twenty year patent term provisions of 35 U.S.C. 154(a)(2).

[21] Appl. No.: 08/730,488

[22] Filed: Oct. 11, 1996

Related U.S. Application Data

[60] Provisional application No. 60/005,192, Oct. 13, 1995.

[51] Int. Cl.$^6$ ..................................................... B23Q 17/00
[52] U.S. Cl. .......................... 29/407.1; 29/833; 29/834; 29/464; 29/721; 33/562
[58] Field of Search .............................. 29/833, 834, 464, 29/468, 720, 721, 407.1, 739, 743, 759; 33/562; 294/64.1; 228/49.1, 56.5, 180.22, 103

[56] References Cited

U.S. PATENT DOCUMENTS

| 4,528,747 | 7/1985 | Hoffman et al. | 29/834 |
| 4,733,462 | 3/1988 | Kawatani | 29/759 X |
| 4,748,739 | 6/1988 | Muradliyan | 29/759 X |
| 4,956,911 | 9/1990 | Zaremba et al. | 29/834 X |
| 5,232,372 | 8/1993 | Bradley et al. | 29/834 X |
| 5,446,960 | 9/1995 | Isaacs et al. | 29/834 |
| 5,526,974 | 6/1996 | Gordon et al. | 228/103 |
| 5,542,457 | 8/1996 | Gordon et al. | 140/147 |
| 5,710,063 | 1/1998 | Forehand et al. | 29/833 X |

FOREIGN PATENT DOCUMENTS 6-125197  5/1994  Japan ....................................... 29/834

Primary Examiner—David P. Bryant
Attorney, Agent, or Firm—Fish & Richardson P.C.

[57] ABSTRACT

A template for aligning a rework tool head and a substrate (such as a printed circuit board) for the accurate placement of a ball grid array package on the substrate with the head, prior to soldering the package to the substrate. The template has a top formed to attach the template to the head in a reproducible position and an indicator rigidly connected to the top to align the template to a feature on the substrate. In one embodiment, the template has a top side formed to mimic the top of the ball grid array package and a bottom side rigidly connected to the top side and formed to show the placement of the balls on the bottom of the ball grid array package in reference to the top of the ball grid array package. Used for the accurate placement of a ball grid array package on a substrate with a head, this embodiment of the template is attached to the head in the place of the package, the head and/or substrate are moved to align bottom of the template with the part of the substrate to which the package is to be attached, and removing the template from the head without changing the alignment.

18 Claims, 1 Drawing Sheet

BALL GRID ARRAY REWORK ALIGNMENT TEMPLATE

CROSS REFERENCE TO RELATED APPLICATIONS

Under 35 USC § 119(e), this application claims the benefit of prior U.S. application Ser. No. 60/005,192, filed Oct. 13, 1995.

BACKGROUND OF THE INVENTION

1. Field of the Invention

The invention relates to attaching or soldering BGA packaged components to substrates, and, in particular, to circuit boards in the process of reworking the circuit boards.

2. Background

Ball grid array (BGA) packages present many advantages to the electronics industry, such as reduced package size, increased input/output switching, and resiliency for initial production placement, because of the absence of leads typical to most surface mount components, which are susceptible to bending/deforming while handling.

One of the principal drawbacks to BGA packages has been the difficulty of replacing a BGA package back on a printed circuit board (PCB) during rework or repair. The process of rework and repair of a PCB is typically done in a selective manner, that is, not in a high volume or repetitive manner. In rework, each component package is usually individually removed and replaced, without use of the expensive pick and place machinery, with optical alignment features, that are generally used in the initial manufacture. Thus, because a BGA package does not allow a rework technician visibility under the BGA package to align the package's solder balls with the corresponding solder pads on the PCB, a serious problem has long existed for the rework technician who does not have use of such expensive pick and place machinery.

A currently available solution to this problem is a split beam vision system consisting of a prism, video camera, and monitor. Briefly, the camera with the aid of the prism allows the technician to "see" both the balls underneath the BGA and the grid of pads on top of the PCB where it is to be placed. By superimposing the two images on top of each other, an accurate alignment can be made before placing the BGA on the PCB to the soldered. This is a very costly solution.

SUMMARY OF THE INVENTION

In general, in one aspect, the invention provides a template for aligning a rework tool head and a substrate (such as a printed circuit board) for the accurate placement of a ball grid array package on the substrate with the head, prior to soldering the package to the substrate. The template has a top formed to attach the template to the head in a reproducible position and an indicator rigidly connected to the top to align the template to a feature on the substrate. In one aspect, the template has a top formed to mimic the top of the ball grid array package. In another aspect, the indicator of the template includes a bottom rigidly connected to the top and formed to show the placement of the balls on the bottom of the ball grid array package in reference to the top of the package. In another aspect, the peripheral edges of the bottom of the template show the placement of the balls on the bottom of the package. In another aspect, the bottom of the template has one or more reference indicators, each rigidly connected to the top of the template, which indicators are used to align the head with the substrate for placement of the package. In another aspect, the template has a reference structure by which the template can be placed in a known position in the head by fitting the reference structure to a complementary structure in the head.

In general, in one aspect, the invention provides a method used for the accurate placement of a ball grid array package on a substrate with a head of a rework machine. In the method, the template is attached to the head, the head or the substrate or both are moved to align bottom of the template with a feature of the substrate to which the package is to be attached, and removing the template from the head without changing the alignment. In another aspect, the template is attached to the head in the place of the ball grid array package.

The invention has a number of advantages. For example, the template is lightweight. It is inexpensive and easy to manufacture. It is quick and easy to use. It provides reproducible and accurate alignment. It is compatible with a wide range of rework machines. It is adaptable to any BGA package configuration and any ball grid pattern.

Other advantages and features will become apparent from the following description and from the claims.

BRIEF DESCRIPTION OF THE DRAWINGS

The accompanying drawings, which are incorporated in, and constitute a part of, the specification, schematically illustrate specific embodiments of the invention and, together with the general description given above and the detailed description of the embodiments given below, serve to explain the principles of the invention.

DETAILED DESCRIPTION

Figure 1:
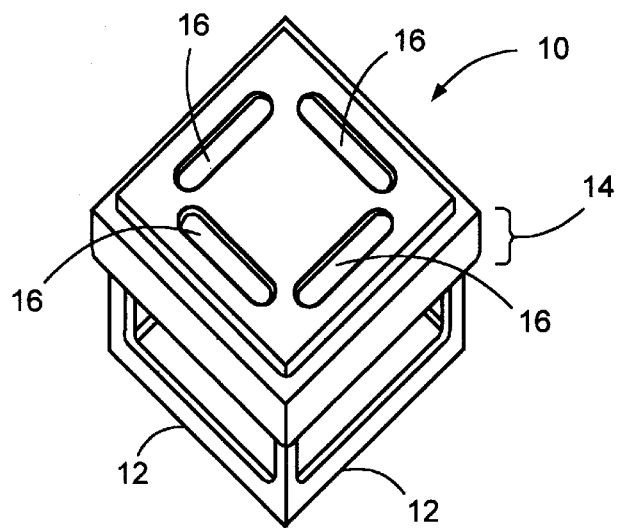
FIG. 1 is a perspective view of a BGA alignment template.
Figure 2:
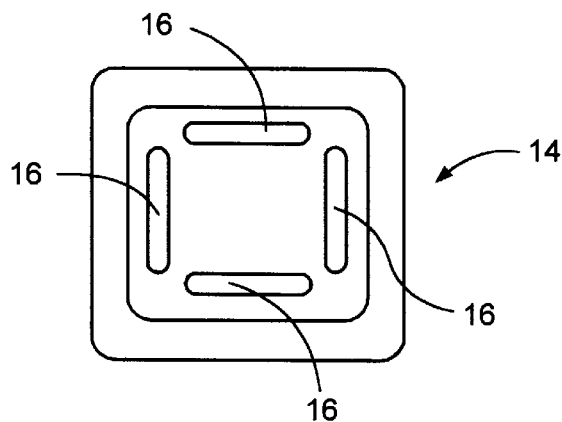
FIG. 2 is a top view of the BGA alignment template shown in FIG. 1.
Figure 3:
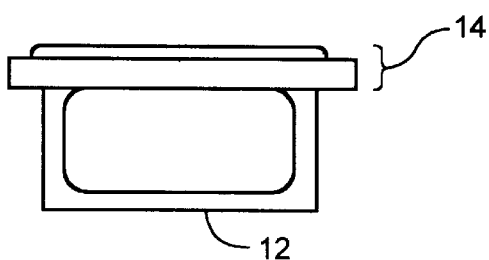
FIG. 3 is a front view of the BGA alignment template shown in FIG. 1.
Figure 4:
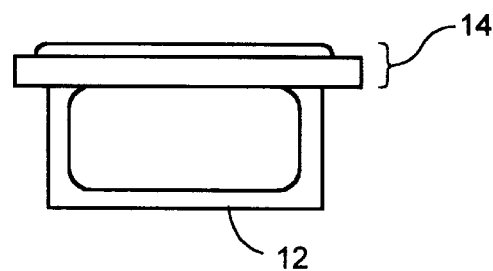
FIG. 4 is a side view of the BGA alignment template shown in FIG. 1.
Figure 5:
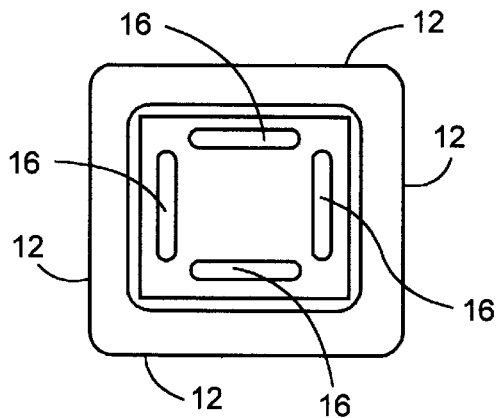
FIG. 5 is a bottom view of the BGA alignment template shown in FIG. 1.

Turning to FIG. 1, a BGA alignment template 10 allows a prototype engineer or technician to place a BGA package (not shown) onto a printed circuit board (PCB), or other substrate, with consistent accuracy.

The bottom of the template 10 has peripheral edges 12 matching the exact perimeter of the outside outline of the solder pads on the PCB where the BGA package (for which the template is to be used) is to be placed. The top side (i.e., the side opposite the bottom) of the template 10 has a shape that matches the top side of the BGA package. For example, most BGA packages consist of a thin substrate (board) with a plastic or a ceramic package mounted on top that houses the chip. The top side 14 of a template 10 for use with such a BGA package will have the same configuration. Thus, the template 10 mimics the top of a BGA component package on the top side 14 of the template and shows the placement of the PCB solder pad on the bottom side of the template.

The template 10 is for use with a surface mount rework and repair machine. Surface mount rework and repair machines are widely available and include, for example, the Ungar SM-1000 and the Weller WHA-1000 from Cooper Tools of Raleigh, N.C.; the Pace Craftmatic from Pace Inc. of Laurel, Md.; and the FRC series machines from OK Industries of Yonkers, N.Y.; AirVac Engineering Co. of Milford, Conn.; and the Chipmaster from Automated Production Corp. of Medford, N.Y. Such machines typically have a head for holding a component. The head typically includes a hot air convection heater or a conduction heater and a vacuum suction cup pickup or a mechanical pickup.

The template 10, being made of aluminum and hollowed out, is light enough to be held by the same means that are used by the rework machine to hold the BGA package.

For alignment, the top side 14 is inserted into the heating head of a rework tool (either conductive or convective for reflow) and is attached to the heating head as a BGA package would be, whether by vacuum or mechanically. The PCB is then brought up to the template 10 or the template 10 is lowered to the PCB and the bottom side of the template 10 is lined up to match the solder pads where the BGA package is to be placed. This can be done with an x/y table with theta adjustment or it can be done manually. Alignment of the heating head and the PCB has thus been completed.

The template 10 can then be removed from the heating head, without changing the alignment, and the BGA package inserted. The BGA package can now be placed accurately onto the PCB and reflow of solder commenced to attach the package.

The template 10 is machined aluminum, which sinks very little heat from the head. It is hollowed out to provide good vision for the technician in aligning the template 10 to the PCB. Holes 16 are optionally provided on the top side 14 to reduce weight. Holes 16 are placed to avoid the area to which a suction vacuum cup on a rework heating head would attach.

The present invention has been described in terms of specific embodiments. The invention, however, is not limited to these specific embodiments. Rather, the scope of the invention is defined by the following claims, and other embodiments are within the scope of the claims. For example, the template may be made of metals other than aluminum, or of plastic, ceramic, composite, or other materials, or a combination of any of them. The template may be formed by machining, molding, or other manufacturing process. The template may be hollow in patterns other than those of the illustrated embodiment, or not at all. The indicator or indicators to be aligned to the substrate may align to one or more features on the substrate and may be points, edges, indentations, holes, or other structures that can be visualized and aligned.

What is claimed is:

1. A template for aligning a rework tool head to place a ball grid array package onto a receiving position on a substrate, the template comprising:
    a top portion having substantially the same shape and size as the top of the ball grid array package, wherein the top portion is configured to attach directly and removably to the rework-tool head in substantially the same manner the ball grid array is attached to the rework-tool head; and
    an indicator rigidly connected to the top portion for visually aligning the rework-tool head to place the ball grid array onto a receiving position on the substrate.

2. The template of claim 1 where the indicator includes an edge configured to show the placement of solder balls on the bottom of the ball grid array package in reference to the top of the ball grid array package.

3. The template of claim 1 where the template is made of aluminum.

4. The template of claim 3, wherein the template has a plurality of openings to provide good vision for a technician in aligning the rework tool head to a receiving position on the substrate.

5. The template of claim 1, wherein the indicator includes at least one of a point, an edge, an indentation, or a hole.

6. The template of claim 1, wherein the template is a unitary whole having no moving parts at any time.

7. The template of claim 1, wherein the template is hollow to provide an unobstructed view of the solder pads on the substrate where the ball grid array package is to be placed and to aligned the rework tool head to the solder pads.

8. The template of claim 7, wherein the template is a unitary piece of aluuiinum having no moving arts at any time.

9. A template for aligning a rework tool head to place a ball grid array package onto a receiving position on a substrate, the template comprising:
    a top portion configured to attach directly and removably to the rework tool head in substantially the same manner the ball grid array is attached to the rework-tool head; and
    an indicator rigidly connected to the top portion for visually aligning the rework-tool head to place the ball grid array on any respective one of a plurality of receiving positions not previously aligned with the rework tool head.

10. The template of claim 9, wherein the template is a unitary whole having no moving parts at any time.

11. The template of claim 9 where the indicator includes an edge configured to show the placement of solder balls on the bottom of the ball grid array package in reference to the top of the ball grid array package.

12. The template of claim 9, wherein the template is made of aluminum.

13. The template of claim 9, wherein the template has a plurality of openings to provide good vision for a technician in aligning the rework-tool head over a receiving position on the substrate.

14. The template of claim 9, wherein the indicator includes at least one of a point, an edge, an indentation, or a hole.

15. A method for aligning a rework tool head and a substrate for the accurate placement of a ball grid array package onto solder pads on the substrate with the head, the method comprising:
    providing a template having a top side formed to have the same configuration as the top of the ball grid array package and a bottom side rigidly connected to the top side and formed to show the placement of the balls on the bottom of the ball grid array package in reference to the top of the ball grid array package;
    attaching the template to the head;
    aligning the bottom of the template with the solder pads; and
    removing the template from the head without changing the alignment before the ball grid array package is placed on the substrate.

16. A method for aligning a rework tool head and a substrate for the accurate placement of a ball grid array package on the substrate with the head, the method comprising:
    providing a template having a top formed to attach the template to the head in a reproducible position and an indicator rigidly connected to the top;
    attaching the template to the head;
    aligning the indicator of the template with a feature of the substrate; and
    removing the template from the head without changing the alignment before the ball grid array package is placed on the substrate.

17. The method of claim 16 where the top of the template is formed to have the same configuration as the top of the ball grid array package.

18. The method of claim 16 where the alignment includes aligning a bottom edge of the template visually with the feature of the substrate.

* * * * *